United States Patent
Shin et al.

(10) Patent No.: US 11,442,107 B2
(45) Date of Patent: *Sep. 13, 2022

(54) SYSTEM-ON-CHIP FOR AT-SPEED TEST OF LOGIC CIRCUIT AND OPERATING METHOD THEREOF

(71) Applicant: SAMSUNG ELECTRONICS CO., LTD., Suwon-si (KR)

(72) Inventors: Beom Seok Shin, Seoul (KR); Jinsoo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/206,288

(22) Filed: Mar. 19, 2021

(65) Prior Publication Data

US 2021/0223315 A1    Jul. 22, 2021

Related U.S. Application Data

(63) Continuation of application No. 16/544,160, filed on Aug. 19, 2019, now Pat. No. 10,969,432.

(30) Foreign Application Priority Data

Jan. 10, 2019  (KR) .................. 10-2019-0003372

(51) Int. Cl.
*G01R 31/3185* (2006.01)
*G01R 31/3177* (2006.01)
*G01R 31/317* (2006.01)

(52) U.S. Cl.
CPC . *G01R 31/318547* (2013.01); *G01R 31/3177* (2013.01); *G01R 31/31712* (2013.01);

(Continued)

(58) Field of Classification Search
CPC .... G01R 31/318547; G01R 31/318594; G01R 31/3177; G01R 31/31712;

(Continued)

(56) References Cited

U.S. PATENT DOCUMENTS 7,007,213 B2   2/2006 Wang et al.
7,194,669 B2   3/2007 Nadeau-Dostie
(Continued)

FOREIGN PATENT DOCUMENTS

KR   10-2011-0136531 A   12/2011

OTHER PUBLICATIONS

V. Vorisek, T. Koch and H. Fischer, "At-speed testing of SOC ICs," Proceedings Design, Automation and Test in Europe Conference and Exhibition, Paris, France, 2004, pp. 120-125 vol. 3. (Year: 2004).*

(Continued)

*Primary Examiner* — Cynthia Britt
(74) *Attorney, Agent, or Firm* — Lee IP Law, P.C.

(57) ABSTRACT

A system-on-chip includes a first scan register being in a first core and being closest to an input port of the first core; an inverting circuit on a feedback path of the first scan register; a second scan register in the first core; and a logic circuit on a data path between the first scan register and the second scan register. In a test mode for an AT-SPEED test of the logic circuit, the inverting circuit generates test data by inverting scan data that are output from the first scan register, the first scan register stores the test data in response to a first pulse of a clock signal, the logic circuit generates result data based on the test data that are output from the first scan register, and the second scan register stores the result data in response to a second pulse of the clock signal.

20 Claims, 13 Drawing Sheets

(52) U.S. Cl.
CPC .......... *G01R 31/31724* (2013.01); *G01R 31/318594* (2013.01); *G01R 31/318569* (2013.01)

(58) Field of Classification Search
CPC ...... G01R 31/31724; G01R 31/318569; G01R 31/318533; G01R 31/318536; G01R 31/2836; G01R 31/31725; G01R 31/31727; G01R 31/318552
See application file for complete search history.

(56) References Cited

U.S. PATENT DOCUMENTS

| | | |
|---|---|---|
| 7,380,181 B2 | 3/2008 | Goel |
| 7,487,419 B2 | 2/2009 | Mukherjee et al. |
| 7,793,179 B2 | 9/2010 | Sul |
| 7,836,370 B2 | 11/2010 | Satoi et al. |
| 8,174,402 B2 | 5/2012 | Bouse et al. |
| 9,366,724 B1 | 6/2016 | Carder et al. |
| 10,969,432 B2 * | 4/2021 | Shin ................. G01R 31/31712 |
| 2006/0181427 A1 | 8/2006 | Bouse et al. |
| 2012/0221906 A1 | 8/2012 | Shetty et al. |
| 2014/0088912 A1 | 3/2014 | Benerjee et al. |

OTHER PUBLICATIONS

Iwata, et al., "An Effective At-Speed Scan Testing Approach Using Multiple-Timing Clock Waveforms," 2012 IEEE 21$^{st}$ Asian Test Symposium, pp. 1-1, (2012).

* cited by examiner

SYSTEM-ON-CHIP FOR AT-SPEED TEST OF LOGIC CIRCUIT AND OPERATING METHOD THEREOF

CROSS-REFERENCE TO RELATED APPLICATIONS

This is a continuation application based on pending U.S. patent application Ser. No. 16/544,160, filed on Aug. 19, 2019, the entire contents of which is hereby incorporated by reference.

Korean Patent Application No. 10-2019-0003372, filed on Jan. 10, 2019, in the Korean Intellectual Property Office, and entitled: "System-On-Chip for At-Speed Test of Logic Circuit and Operating Method Thereof," is incorporated by reference herein in its entirety.

BACKGROUND

1. Field

Embodiments of the inventive concept described herein relate to a system-on-chip, and more particularly, relate to a system-on-chip that performs an AT-SPEED test of a logic circuit and an operating method of the system-on-chip.

2. Description of the Related Art

A system-on-chip (SoC) is a semiconductor chip, in which a system for performing various functions is implemented. A design for testability (DFT) technique has been used to test logic circuits in the system-on-chip. Among the DFT technique, a scan test is a testing technique for testing a logic circuit by verifying output data based on input scan pattern data. Faults of the logic circuit, e.g., a stuck fault, a transition delay fault, etc., may be identified based on the scan test. An AT-SPEED test as the scan test may be performed to identify the transition delay fault of the logic circuit.

As demand for more complicated computation increases, a SoC (hereinafter referred to as a "multi-core SoC"), on which a plurality of cores are mounted, has been widely used. As amounts of data exchange between the plurality of cores increases in testing the multi-core SoC, it may be desirable to test interface circuits between the plurality of cores. However, when the cores are individually tested, the AT-SPEED test may not be properly and efficiently performed on the interface circuits.

SUMMARY

Embodiments are a system-on-chip including a plurality of cores including a first scan register being in a first core of a plurality of cores and being closest to an input port of the first core; an inverting circuit on a feedback path of the first scan register; a second scan register in the first core; and a logic circuit on a data path between the first scan register and the second scan register. In a test mode for an AT-SPEED test of the logic circuit, the inverting circuit generates test data by inverting scan data that are output from the first scan register, the first scan register stores the test data in response to a first pulse of a clock signal, the logic circuit generates result data based on the test data that are output from the first scan register, and the second scan register stores the result data in response to a second pulse of the clock signal.

Embodiments are a system-on-chip including a plurality of cores including a first scan register that is in a first core of the plurality of cores and is closest to an output port of the first core; a first inverting circuit on a feedback path of the first scan register; a second scan register that is in a second core of the plurality of cores and is closest to an input port of the second core; and a logic circuit on a data path between the first scan register and the second scan register. In a test mode for an AT-SPEED test of the logic circuit, the first inverting circuit generates first test data by inverting scan data that are output from the first scan register, the first scan register stores the first test data in response to a first pulse of a clock signal, the logic circuit generates result data based on the first test data that are output from the first scan register, and the second scan register stores the result data in response to a second pulse of the clock signal.

Embodiments are an operating method of a system-on-chip for an AT-SPEED test of a logic circuit on a data path between a first scan register and a second scan register. The method includes outputting, by the first scan register, scan data in response to a clock signal having a first frequency; providing the first scan register with test data generated by inverting the scan data that are output from the first scan register; outputting, by the first scan register, the test data in response to a first pulse of the clock signal having a second frequency; outputting, by the logic circuit, result data based on the test data that are output from the first scan register; and outputting, by the second scan register, the result data in response to a second pulse of the clock signal having the second frequency.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, embodiments may be described in detail and clearly to such an extent that an ordinary one in the art easily implements the embodiments.

Figure 1:
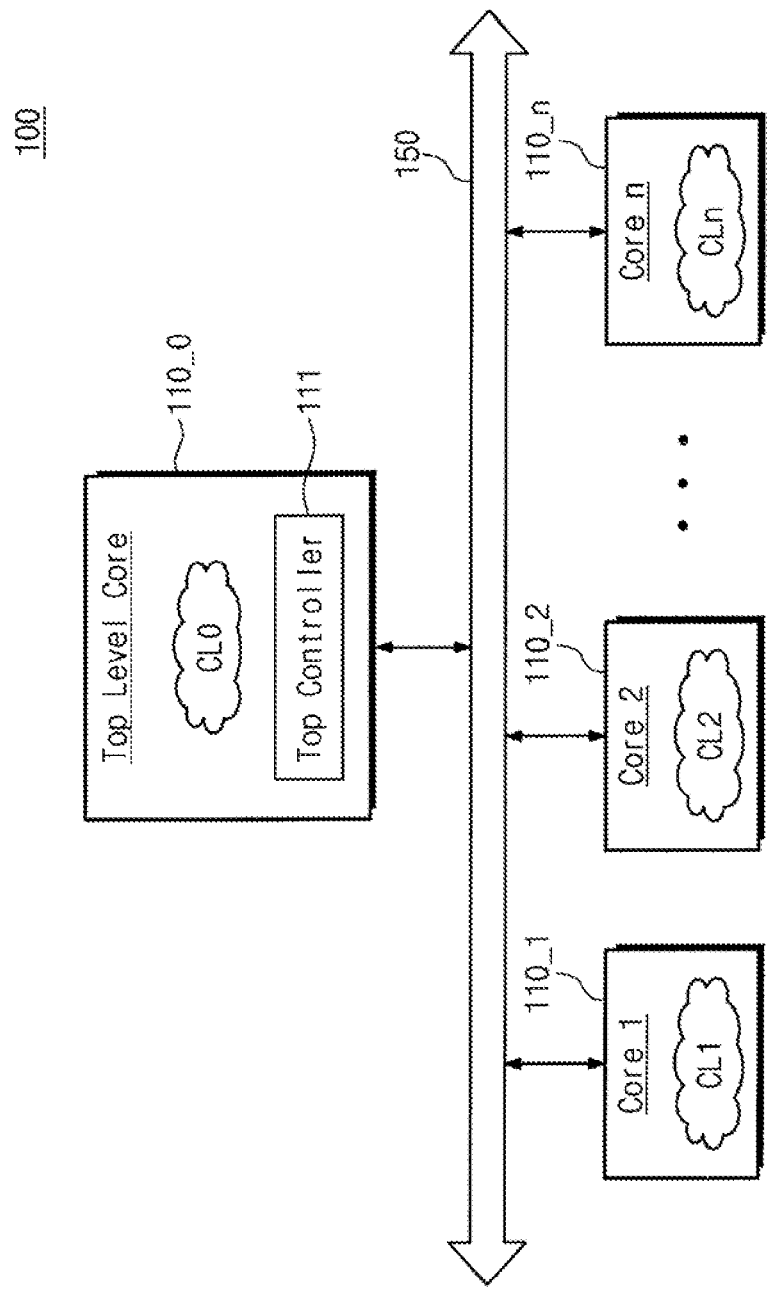
FIG. 1 illustrates a system-on-chip (SoC) according to an exemplary embodiment.

FIG. 1 illustrates a system-on-chip (SoC) 100 according to an exemplary embodiment. Referring to FIG. 1, the SoC 100 may include a plurality of cores 110_0 to 110_n and a bus 150. For example, the SoC 100 may include 0-th to n-th cores 110_0 to 110_n. For example, the 0-th core 110_0 may be a top level core, and the first to n-th cores 110_1 to 110_n may be low level cores. Each of the plurality of cores 110_0 to 110_n may process input data. For example, each of the plurality of cores 110_0 to 110_n may perform various operations based on the input data.

The plurality of cores 110_0 to 110_n may include logic circuits CL0 to CLn, respectively. Each of the logic circuits CL0 to CLn may include a plurality of combinational logic circuits and a plurality of sequential logic circuits. Each of the plurality of cores 110_0 to 110_n may process data by an internal logic circuit therein. For example, the top level core 110_0 may process data by the 0-th logic circuit CL0 therein. A first core 110_1 may process data by the first logic circuit CL1 therein.

For example, the plurality of cores 110_0 to 110_n may be included in a function block of a central processing unit (CPU), a graphic processing unit (GPU), a digital signal processor (DSP), a neural processing unit (NPU), etc. For example, the plurality of cores 110_0 to 110_n may be included in separated function blocks.

The top level core 110_0 may control operations of the low level cores 110_1 and 110_n. The top level core 110_0 may include a top controller 111. The top controller 111 may generate control signals for controlling the low level cores 110_1 to 110_n and may provide the generated control signals to the low level cores 110_1 to 110_n.

The low level cores 110_1 to 110_n may operate based on the control signals from the top level core 110_0. For example, in response to a control signal, the first core 110_1 may process data by the first logic circuit CL1 therein. For example, the low level cores 110_1 to 110_n may be commonly connected to the bus 150. Alternatively, the low level cores 110_1 to 110_n may be connected to different buses.

The bus 150 may provide a data path for communication between the plurality of cores 110_0 to 110_n. For example, the top level core 110_0 may provide data or a control signal to the first core 110_1 through the bus 150. The first core 110_1 may provide data to the top level core 110_0 through the bus 150. The first core 110_1 and the second core 110_2 may exchange data with each other through the bus 150.

To determine whether the logic circuits CL0 to CLn of the plurality of cores 110_0 to 110_n are faulty, the plurality of cores 110_0 to 110_n may be designed in consideration of testability. For example, the plurality of cores 110_0 to 110_n may have design for testability (DFT) circuitry. For example, the cores 110_0 to 110_n may constitute at least one scan chain for a scan test such that defects of the logic circuit CL0 to CLn are detected in a scan test manner. For example, scan pattern data (hereinafter referred to as "scan data") for the scan test may be input to the plurality of cores 110_0 to 110-n. The scan data may have data values that are set for the scan test in advance. The logic circuits CL0 to CLn of the plurality of cores 110_0 to 110_n may process data based on the scan data to generate output data as a processing result. The defects of the logic circuits CL0 to CLn may be identified based on the output data. For example, a transition delay fault of the logic circuits CL0 to CLn may be identified by using the scan test manner.

In an exemplary embodiment, an AT-SPEED test may be performed on the logic circuits CL0 to CLn to identify the transition delay fault of the logic circuits CL0 to CLn. The AT-SPEED test may be a test for determining whether the logic circuits CL0 to CLn transfer data without an abnormal delay at an operating speed (i.e., at operating clock frequency) of the SoC 100. For example, in the AT-SPEED test, the logic circuits CL0 to CLn may be tested based on a driving clock signal for a normal operation (hereinafter referred to as a "normal function") of the SoC 100. For example, although the normal operation of the SoC 100 and the AT-SPEED test may be performed using the same clock signal having the same clock frequency, the AT-SPEED test may be different from the normal operation of the SoC 100, because the AT-SPEED test is performed to identify the transition delay fault of the logic circuits CL0 to CLn based on the scan data.

The top controller 111 may control the scan test on the plurality of cores 110_0 to 110_n. The top controller 111 may provide control signals for the scan test to the plurality of cores 110_0 to 110_n. For example, when the plurality of cores 110_0 to 110_n operate in response to the control signals from the top controller 111, the scan test may be performed on the logic circuits CL0 to CLn.

For the scan test, the plurality of cores 110 to 140 may be tested individually. For example, the scan test for the top level core 110 and the scan test for the first core 110_1 may be respectively performed. For example, a hierarchical scan test for the plurality of cores 110_0 to 110_n may be performed. In contrast, when the scan test is performed on all the cores 110_0 to 110_n of the SoC 100 (i.e., when the hierarchical scan test for the cores 110_0 to 110_n is not performed), a resource and a test time for the scan test may be increased. Thus, the hierarchical scan test may be performed to decrease the resource and the test time.

In general, when a hierarchical scan test for cores is performed, an AT-SPEED test for a logic circuit in an interface between the cores may not be efficiently performed. However, according to an exemplary embodiment, when the hierarchical scan test for the plurality of cores 110_0 to 110_n is performed, the AT-SPEED test may be properly performed regardless of positions of the logic circuits CL0 to CLn of the plurality of cores 110_0 to 110_n.

Figure 2:
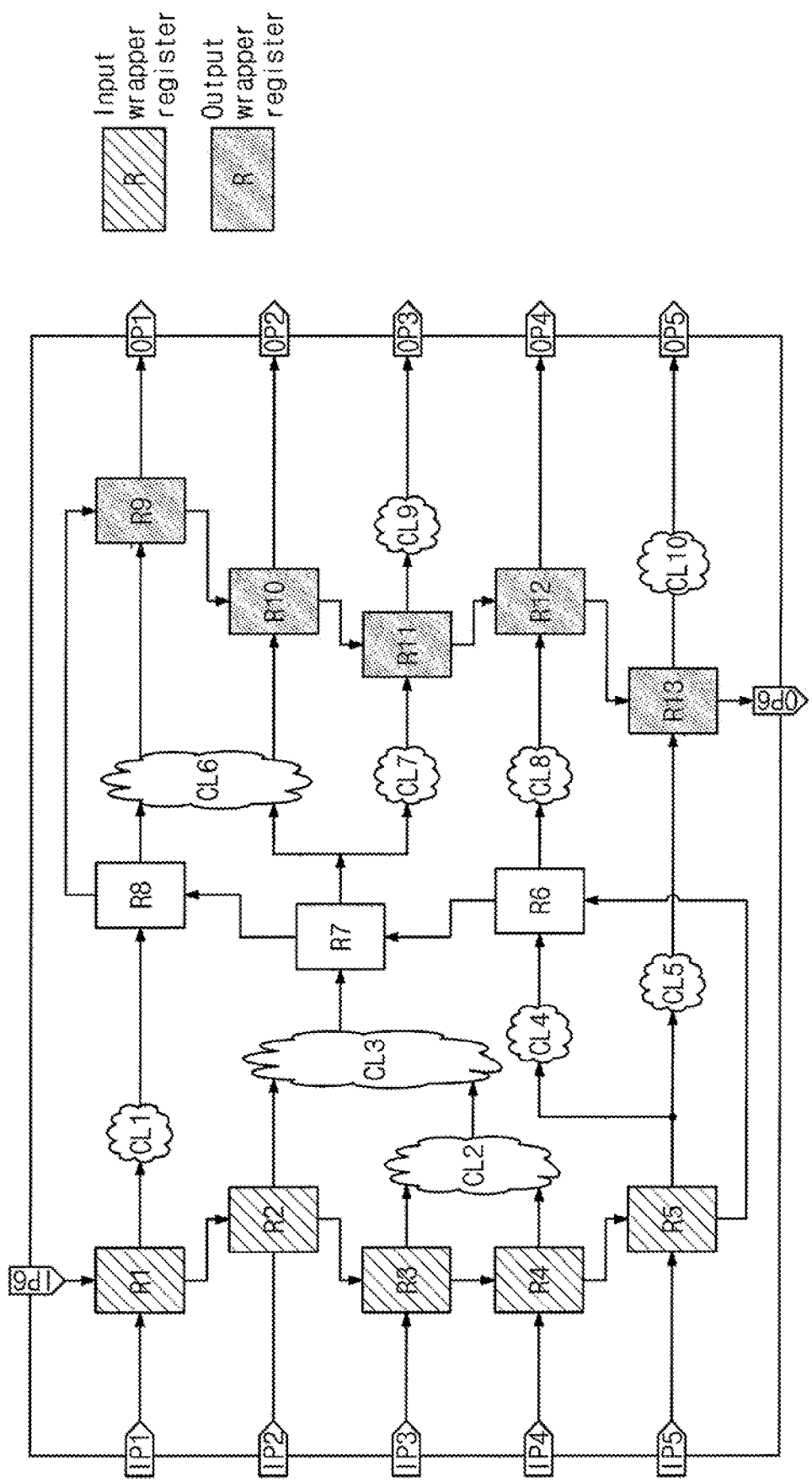
FIG. 2 illustrates one example of a first core of FIG. 1.

FIG. 2 illustrates an example of the first core 110_1 of FIG. 1. For example, components of the low level cores 110_1 to 110_n will be described with reference to FIG. 2. Although the first core 110_1 is illustrated in FIG. 2, the remaining cores 110_2 to 110_n may be implemented to be substantially identical or similar to the first core 110_1.

Referring to FIG. 2, the first core 110_1 may include a plurality of input ports IP1 to IP6, a plurality of registers R1 to R13, a plurality of logic circuits CL1 to CL10, and a plurality of output ports OP1 to OP6.

The input ports IP1 to IP6 may receive data that are provided to the first core 110_1. For example, the sixth input port IP6 may receive scan data for the scan test. The registers R1 to R13 may store data that are input in response to a clock signal provided to the first core 110_1. The logic circuits CL1 to CL10 may operate based on received data. The output ports OP1 to OP6 may output data from the first core 110_1. For example, the sixth output port OP6 may output result data that are generated by the logic circuits CL1 to CL10 based on the scan data.

The registers R1 to R5, which are respectively closest to the input ports IP1-IP5, among the registers R1 to R13 may be defined as input wrapper registers. Each of the input wrapper registers may be positioned at an input boundary of the first core 110_1. For example, an input wrapper register may be defined as the first one among registers that are positioned on each data path between an input port and an output port. Each of the registers R9-R13, which are closest to the output ports OP1 to OP5, among the registers R1 to R13 may be defined as output wrapper registers. Each of the output wrapper registers may be positioned at an output boundary of the first core 110_1. For example, an output wrapper register may be the last one among registers that are positioned on each data path between an input port and an output port.

When the first core 110_1 performs a normal function (i.e., a normal operation), input data, which are input to each of the input ports IP1 to IP5, may be processed by a register(s) and a logic circuit(s) that are arranged in a data path. The processed input data may be output through the output ports OP1 to OP5. For example, the input data, which are input to the first input port IP1, may be stored in the first register R1. The data stored in the first register R1 may be output to the first logic circuit CL1. The first logic circuit CL1 may process the data from the first register R1 and may provide the processed data to the eighth register R8. The eighth register R8 may store data that are output from the first logic circuit CL1. The sixth logic circuit CL6 may perform an operation based on the data that are output from the eighth register R8. Data that are output from the sixth logic circuit CL6 (i.e., as a result of the operation of the sixth logic circuit CL6), may be stored in the ninth register R9. Data that are output from the ninth register R9, may be output from the first core 110_1 through the first output port OP1.

For example, when the scan test of the first core 110_1 is performed, scan data may be input to the sixth input port IP6. The input scan data may be sequentially transferred from the first register R1 to the thirteenth register R13. For example, each of the first to thirteenth registers R1 to R13 may be a scan register that is used for the scan test. For example, when the scan data are input based on 13 clock pulses (e.g., first to thirteenth clock pulses), each of the first to thirteenth registers R1 to R13 may store corresponding scan data (e.g., first to thirteenth scan data). For example, the first to thirteenth registers R1 to R13 may form a scan chain. The corresponding scan data may be sequentially shifted through the scan chain of the first to thirteenth registers R1 to R13 in response to the first to thirteenth clock pulses. As described above, the first to thirteenth scan data may be transferred without passing through the logic circuits CL1 to CL10, and target data values (e.g., the first to thirteenth scan data) may be stored in the first to thirteenth registers R1-R13, respectively. For example, the first to thirteenth scan data are not processed by the logic circuits CL1 to CL10. After the first and thirteenth scan data, which are not processed, are stored in the first to thirteenth registers R1-R13, the scan test for the logic circuits CL1 to CL10 may be performed based on the stored first and thirteenth scan data. The faults of the logic circuits CL1 to CL10 may be identified through the scan test. For example, the stuck fault and the transition delay fault of the logic circuits CL1 to CL10 may be identified through the scan test.

For convenience of description, a path through which scan data stored in a register are transferred to another register without passing through a logic circuit is referred to as a "scan path", and a path through which data stored in a register are transferred to another register by passing through a logic circuit is referred to as a "function path".

To identify a transition delay fault of a logic circuit through the scan test, the AT-SPEED test may be performed by using three registers. For example, when the AT-SPEED test is performed on the sixth logic circuit CL6, the first register R1, the eighth register R8, and the ninth register R9 may be used to identify the transition delay fault of the sixth logic circuit CL6. For example, the AT-SPEED test of the sixth logic circuit CL6 may be performed by using the first scan data stored in the first register R1. In detail, the first scan data stored in the first register R1 may be processed by the first logic circuit CL1. Data processed by the first logic circuit CL1 may be stored in the eighth register R8. The data stored in the eighth register R8 may be processed by the sixth logic circuit CL6, and the processed data may be stored in the ninth register R9. The data stored in the ninth register R9 may be output through the sixth output port OP6 through the tenth register R10 to the thirteenth register R13. The transition delay fault of the sixth logic circuit CL6 may be identified by comparing a value of the output data with a target value. For example, the sixth logic circuit CL6 may be tested under assumption that the first logic circuit CL1 does not have any defect.

For example, when the AT-SPEED test is performed on a logic circuit in the above manner, the AT-SPEED test may fail to be performed on logic circuits directly connected to output terminals of the input wrapper register or to output terminals of the output wrapper register. For example, the AT-SPEED test may fail to be performed on the first logic circuit CL1 that is connected to the output terminal of the first register R1.

According to an exemplary embodiment, the AT-SPEED test may be performed on a logic circuit based on two registers. For example, the AT-SPEED test may be performed on the first logic circuit CL1 based on the first register R1 and the eighth register R8. Thus, the transition delay fault of logic circuits, which are connected to output terminals of the input wrapper register or the output wrapper register, may be identified by using two registers.

To perform the AT-SPEED test on a logic circuit based on two registers, the first core 110_1 may further include components that are not illustrated in FIG. 2. Exemplary embodiments for an AT-SPEED test of a logic circuit based on two registers will be described with reference to FIGS. 3A to 7 as below.

Figure 3A:
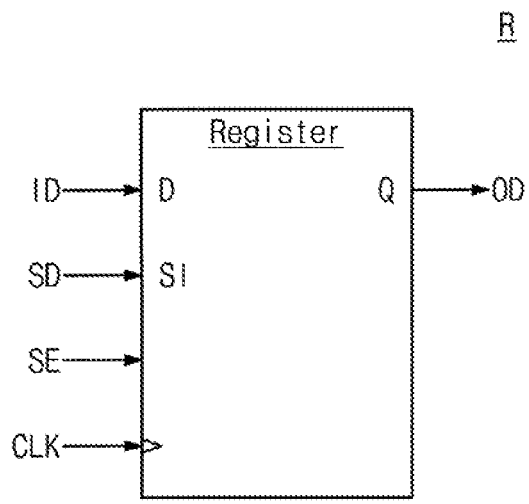
FIG. 3A illustrates a register according to an exemplary embodiment.
Figure 3B:
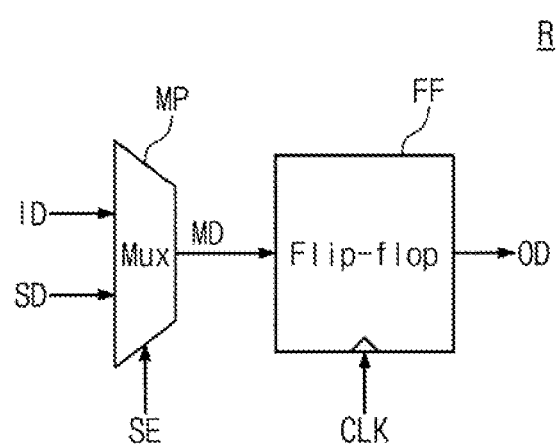
FIG. 3B illustrates an example of a register of FIG. 3A.

FIG. 3A illustrates a register according to an exemplary embodiment, and FIG. 3B illustrates an example for implementing a register of FIG. 3A. Referring to FIG. 3A, a register "R" may include four input terminals and one output terminal. For example, the four input terminals may include an input data terminal "D" and a scan data terminal SI. The four input terminals may receive input data ID, scan data SD, a scan enable signal SE, and a clock signal CLK. The input data ID may be input to the register "R" through the input data terminal "D", and the scan data SD may be input to the register "R" through the scan data terminal SI. Output data OD may be output from one output terminal "Q".

The register "R" may selectively store one of the input data ID and the scan data SD based on the scan enable signal SE and the clock signal CLK and may output the stored data as the output data OD. For example, the register "R" may store the scan data SD in response to a logical high value (i.e., "1") of the scan enable signal SE and a rising edge of the clock signal CLK and may output the scan data SD as the output data OD. For example, the register "R" may store the input data ID in response to a logical low value (i.e., "0") of the scan enable signal SE and a rising edge of the clock signal CLK and may output the input data ID as the output data OD.

Referring to FIG. 3B, the register "R" may include a multiplexer MP and a flip-flop FF. The multiplexer MP may receive the input data ID and the scan data SD. The multiplexer MP may selectively output one of the input data ID and the scan data SD as intermediate data MD based on the scan enable signal SE. The flip-flop FF may store the intermediate data MD that are input in response to the clock signal CLK and may output the intermediate data MD as the output data OD.

Figure 4:
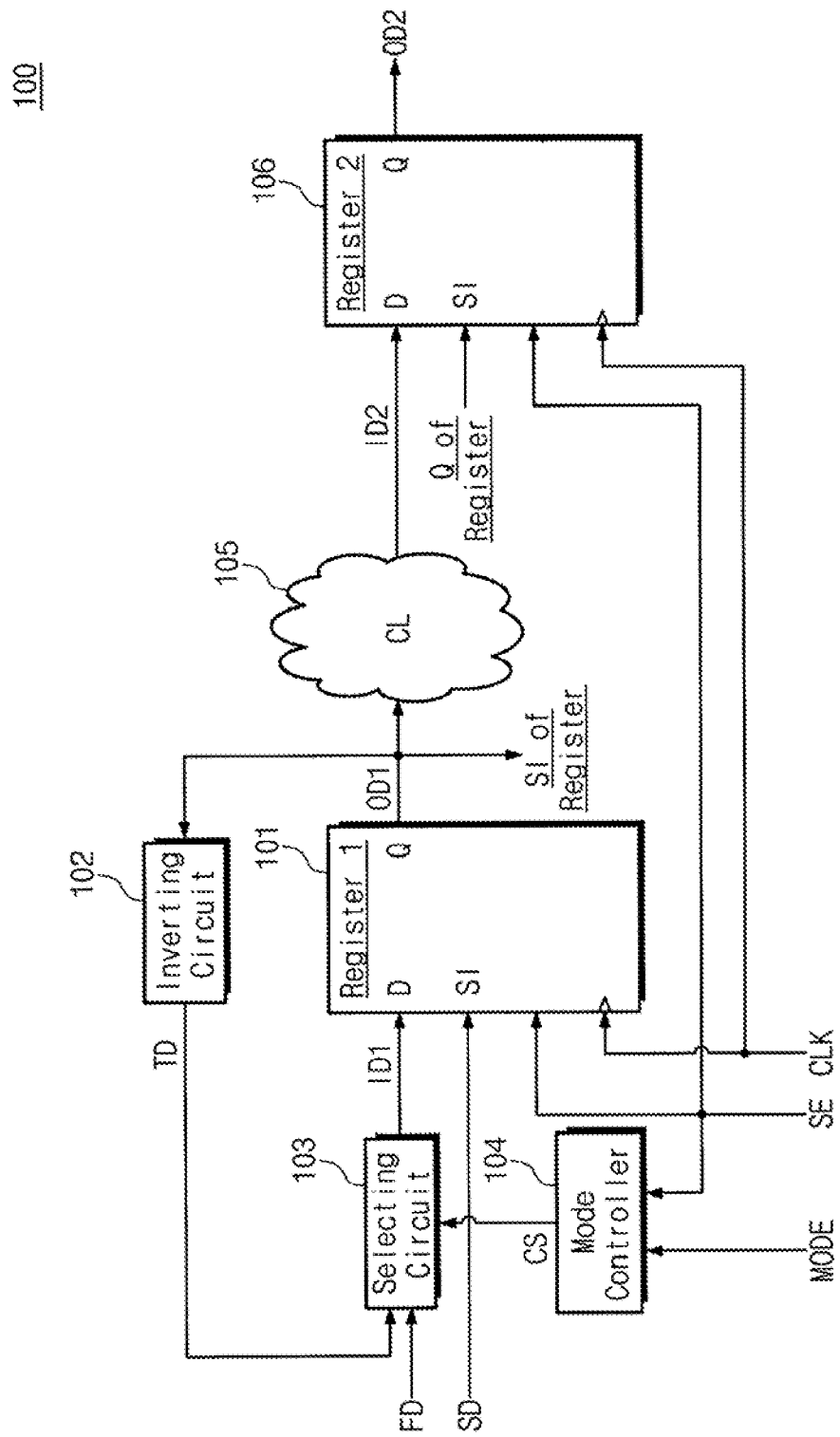
FIG. 4 illustrates a SoC for an AT-SPEED test of a logic circuit according to an exemplary embodiment.

FIG. 4 illustrates the SoC 100 for an AT-SPEED test of a logic circuit according to an exemplary embodiment. Referring to FIG. 4, the SoC 100 may include a first register 101, an inverting circuit 102, a selecting circuit 103, a mode controller 104, a logic circuit 105, and a second register 106.

The first register 101 may receive first input data ID1, a scan data SD, a scan enable signal SE, and a clock signal CLK. The first register 101 may output one of the first input data ID1 and the scan data SD as first output data OD1 based on the scan enable signal SE and the clock signal CLK. As illustrated in FIG. 2, the scan data SD may be provided to the first register 101 through an input port or another register. The first output data OD1 may be provided to the inverting circuit 102, the logic circuit 105, and a scan data terminal SI of another register. For example, the first output data OD1 may be provided to a scan data terminal SI of the second register 106.

The inverting circuit 102 may invert the first output data OD1 to generate test data TD. For example, when a value of the first output data OD1 is "1", a value of the test data TD may be "0". The test data TD output from the inverting circuit 102 may be provided to the selecting circuit 103. For example, the inverting circuit 102 may be implemented with an inverter. For example, the inverting circuit 102 may be implemented with any circuit capable of inverting the first output data OD1 or with a combination of any circuits.

The selecting circuit 103 may receive the test data TD and function data FD. The selecting circuit 103 may selectively output one of the test data TD and the function data FD as the first input data ID1, based on a selection signal CS from the mode controller 104. The function data FD may be provided from an input port or an output terminal "Q" of another register. The SoC 100 may perform a normal function based on the function data FD. For example, the selecting circuit 103 may be implemented with a multiplexer. For example, the selecting circuit 103 may be implemented with any circuit capable of selecting signals.

The mode controller 104 may receive a mode signal MODE and the scan enable signal SE. The mode controller 104 may generate the selection signal CS based on the mode signal MODE and the scan enable signal SE. The mode signal MODE may indicate one of various operating modes of the SoC 100. For example, the mode signal MODE may be provided from the top controller 111 of FIG. 1. For example, the mode signal MODE may indicate a mode for the AT-SPEED test of the logic circuit 105 (hereinafter referred to as an "AT-SPEED test mode").

For example, when the mode signal MODE indicates the AT-SPEED test mode of the logic circuit 105 and when the scan enable signal SE indicates a logical low value, the mode controller 104 may generate the selection signal CS. For example, the selecting circuit 103 may output the test data TD as the first input data ID1 by the selection signal CS. For example, the first input data ID1 (i.e., the test data TD) may be provided to the first register 101. The first register 101 may store the test data TD based on a logical low value of the scan enable signal SE and the clock signal CLK and may output the test data TD as the first output data OD1.

The logic circuit 105 may generate second input data ID2 based on the first output data OD1. The logic circuit 105 may provide the second input data ID2 to the second register 106.

The second register 106 may receive the second input data ID2, the scan enable signal SE, and the clock signal CLK. A scan data terminal SI of the second register 106 may be connected to an output terminal "Q" of another register. For example, the scan data terminal SI of the second register 106 may be connected to the output terminal "Q" of the first register 101. The second register 106 may output second output data OD2 as one of the second input data ID2 and data, which are input to the scan data terminal SI of the second register 106, based on the scan enable signal SE and the clock signal CLK. For example, the data, which are input to the scan data terminal SI, may be scan data that are supplied from another register.

The first register 101 and the second register 106 may be included in the same core. For example, the first register 101 and the second register 106 may be included in the first core 110_1 of FIG. 1. Alternatively, the first register 101 and the second register 106 may be included in different cores, respectively. For example, the first register 101 may be included in the first core 110_1 of FIG. 1, and the second register 106 may be included in the top level core 110_0 of FIG. 1. For example, each of the first register 101 and the second register 106 may be included in any core of the SoC 100.

The first register 101 may be included in an input wrapper register or an output wrapper register. For example, the inverting circuit 102 and the selecting circuit 103 may be positioned on a feedback path of the input wrapper register or the output wrapper register.

Figure 5:
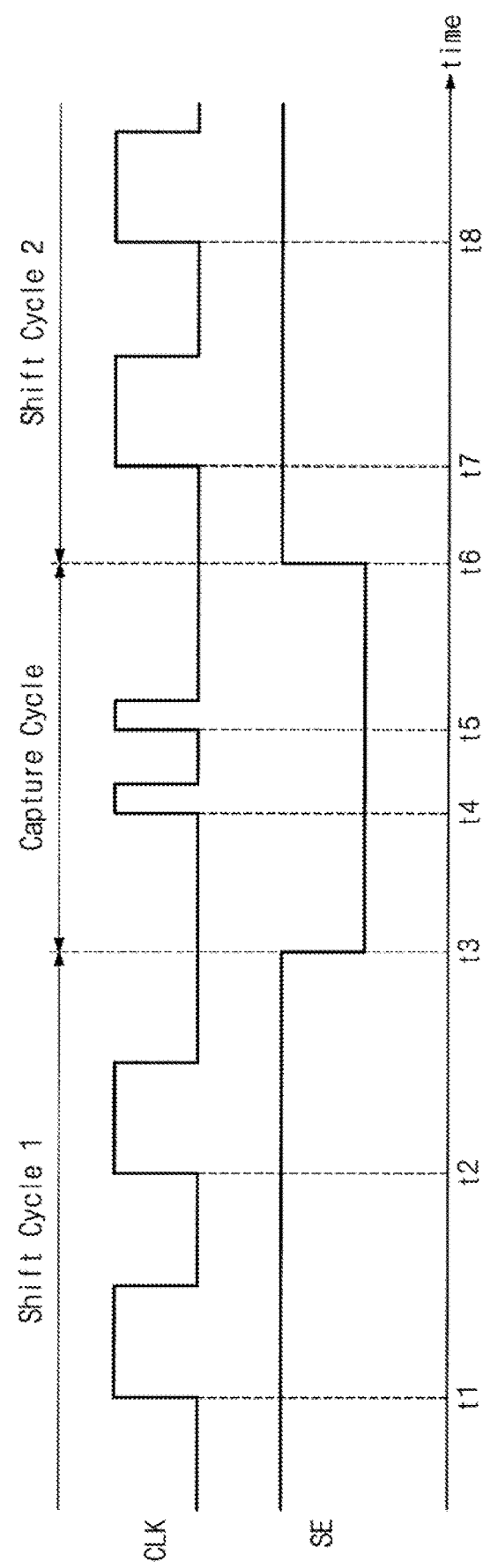
FIG. 5 illustrates a timing diagram of a clock signal and a scan enable signal for an AT-SPEED test according to an exemplary embodiment.

FIG. 5 illustrates a timing diagram of the clock signal CLK and the scan enable signal SE for an AT-SPEED test according to an exemplary embodiment. For example, the clock signal CLK and the scan enable signal SE of FIG. 5 may be provided together with the mode signal MODE for an AT-SPEED test of a logic circuit.

In FIG. 5, a horizontal axis may indicate a time. The AT-SPEED test of the logic circuit may be performed based on a first shift cycle, a capture cycle, and a second shift cycle. In the first shift cycle, scan data may be stored in registers. In the capture cycle, result data, which are output from a logic circuit based on the stored scan data, may be stored in registers. In the second shift cycle, the result data, which are stored in the registers, may be output. A transition delay fault of the logic circuit may be identified based on the output result data. For example, in a shift cycle, data may be sequentially transferred through registers along a scan path. In a capture cycle, data stored in registers along a function path may be processed through a logic circuit.

The clock signal CLK may have a first frequency in the shift cycle and may have a second frequency in the capture cycle. For example, the first frequency may be lower than the second frequency. For example, a pulse width of the clock signal CLK in the shift cycle is longer than a pulse width of the clock signal CLK in the capture cycle. For example, the shift cycle may correspond to a period, during which data are transferred through registers (i.e., a period when scan data are input to registers or result data stored in registers are output). Thus, the frequency of the clock signal CLK may not have influence on the AT-SPEED test. For example, the clock signal CLK may have a lower frequency in the shift cycle than the capture cycle. Thus, power consumptions in the shift cycle may be reduced due to the lower frequency of the clock signal CLK in the shift cycle. In other words, inputting scan data and outputting result data in the shift cycle may be performed with a low power. In the capture cycle, the frequency of the clock signal CLK for the AT-SPEED test may be the same as a frequency of a driving clock signal CLK (i.e., the clock signal CLK for performing a normal function). For example, the AT-SPEED test of the logic circuit may be performed based on the clock signal CLK of the capture cycle.

FIG. 5 illustrates that the clock signal CLK has two pulses in each shift cycle, but embodiments may not be limited thereto. For example, the number of pulses of the clock signal CLK in each shift cycle may vary according to the number of registers to which scan data are input. For example, when N number of registers are used for the scan test, the number of pulse of the clock signal may be N (N is a natural number greater than 1).

An operation of the SoC 100 of FIG. 4 will be more fully described with reference to FIG. 6. For convenience of description, the output terminal "Q" of the first register 101 may be connected to the scan data terminal SI of the second register 106.

Figure 6:
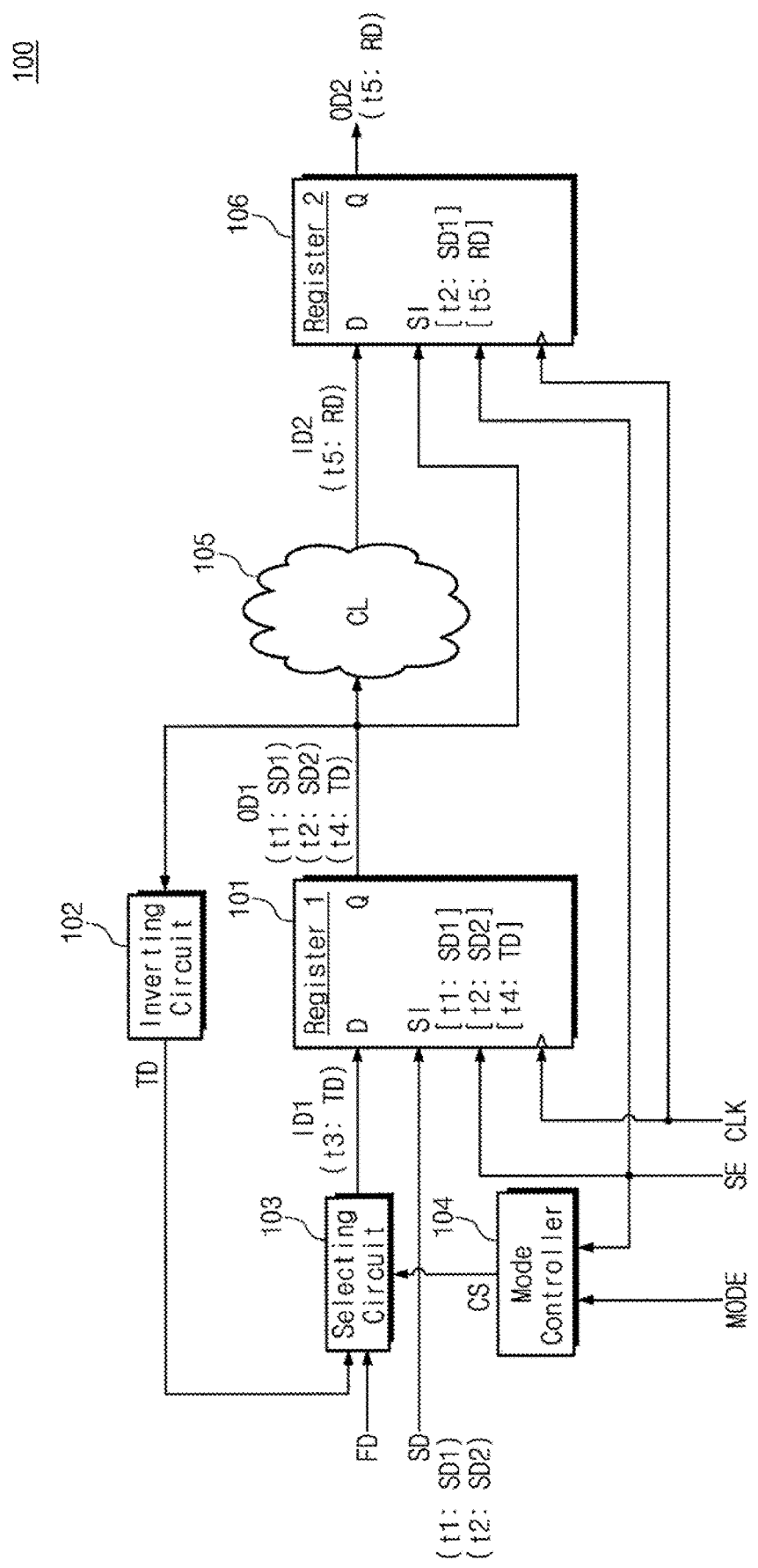
FIG. 6 illustrates an exemplary operation of a SoC of FIG. 4 based on a clock signal and a scan enable signal of FIG. 5.

FIG. 6 illustrates an exemplary operation of the SoC 100 of FIG. 4 based on the clock signal CLK and the scan enable signal SE of FIG. 5. Referring to FIGS. 5 and 6, in the first shift cycle, the first and second registers 101 and 106 may select scan data, which are input to the scan data terminal SI, in response to a logical high value (i.e., "1") of the scan enable signal SE. For example, at a first time t1, first scan data SD1 may be input to the first register 101. The first register 101 may store the first scan data SD1 in response to a first rising edge of the clock signal CLK and may output the first scan data SD1 as the first output data OD1. The first scan data SD1 may be provided to the scan data terminal SI of the second register 106.

At a second time t2, second scan data SD2 may be input to the first register 101. The first register 101 may store the second scan data SD2 in response to a second rising edge of the clock signal CLK and may output the second scan data SD2 as the first output data OD1. The second register 106 may store the first scan data SD1, which are input to the scan data terminal SI, in response to the second rising edge of the clock signal CLK. The second scan data SD2 may be provided to the inverting circuit 102. The inverting circuit 102 may invert the second scan data SD2 to generate the test data TD. The test data TD from the inverting circuit 102 may be provided to the selecting circuit 103.

The selecting circuit 103 may receive the test data TD and the function data FD. Before a time t3, the selecting circuit 103 may output the function data FD as the first input data ID1 based on the selection signal CS that is provided from the mode controller 104. At the third time t3, the mode controller 104 may generate the selection signal CS based on the mode signal MODE and a low value of the scan enable signal SE, such that the test data TD are output from the selecting circuit 103. For example, the mode signal MODE may indicate the AT-SPEED test mode of the logic circuit 105. Thus, at the third time t3, the selecting circuit 103 may output the test data TD as the first input data ID1 in response to the selection signal CS. The output test data TD may be input to the input data terminal "D" of the first register 101.

In the capture cycle (e.g., from the third time t3 to a sixth time t6), the first and second registers 101 and 106 may select input data, which are input to the input data terminals "D" thereof, based on a logical low value (i.e., "0") of the scan enable signal SE. At a fourth time t4, the first register 101 may store the test data TD, which are input to the input data terminal "D" thereof, in response to a third rising edge of the clock signal CLK. Thus, the test data TD may be output as the first output data OD1 of the first register 101. The test data TD may be provided to the logic circuit 105. The logic circuit 105 may perform an operation based on the test data TD and may output result data RD as a result of the operation. For example, the result data RD as the second input data ID2 may be input to the second register 106.

At a fifth time t5, the second register 106 may store the result data RD, which are input to the input data terminal "D" thereof, in response to a fourth rising edge of the clock signal CLK. The second register 106 may output the result data RD as the second output data OD2. In the second shift cycle (i.e., after the sixth time t6), the result data RD stored in the second register 106 may be output from the SoC 100 through a scan path. For example, at a seventh time t7 and an eighth time t8, the result data RD may be sequentially transferred through registers on the scan path (e.g., in response to fifth and sixth rising edges of the clock signal CLK). Thus, the result data RD may be output from the SoC 100 through an output port.

The transition delay fault of the logic circuit 105 may be identified based on a value of the output result data RD. For example, when the value of the result data RD is different from a target value, it may be determined that the logic circuit 105 has the transition delay fault.

For example, when the value of the test data TD is the same as a value of the second scan data SD2, a value of the result data RD, which are output from the logic circuit 105, may be identically maintained. Thus, the AT-SPEED test of the logic circuit 105 may not be properly performed, because the stuck fault and the transition delay fault of the logic circuit 105 are not distinguished from each other. In contrast, when the test data TD is generated by inverting the second scan data SD2, the value of the test data TD may be different from the value of the second scan data SD2. Thus, the AT-SPEED test of the logic circuit 105 may be properly and efficiently performed.

As described above, the test data TD may be transferred to the first register 101 in the first shift cycle. In the capture cycle, the test data TD may be output from the first register 101 in response to a first pulse P1 of the clock signal CLK. For example, the test data TD may be output from the first register 101 in response to a rising/falling edge of the first pulse P1 of the clock signal CLK in the capture cycle. The second register 106 may store the result data RD in response to a second pulse P2 of the clock signal CLK immediately succeeding the first pulse P1 in the capture cycle. For example, the second pulse P2 of the clock signal CLK may be directly adjacent to the first pulse P1 of the clock signal CLK. For example, the logic circuit 105 may generate the result data RD based on the test data TD during an interval between the rising edge of the first pulse P1 and the rising edge of the second pulse P2. For example, the logic circuit 105 may generate the result data RD based on the test data TD during an interval between the falling edge of the first pulse P1 and the falling edge of the second pulse P2. Thus, the result data RD may be generated by an operation of the logic circuit 105 during an interval between the fourth time t4 and the fifth time t5. Further, when the AT-SPEED test of the logic circuit 105 is performed based on the result data RD that are generated by the operation of the logic circuit 105 during the interval between the fourth time t4 and the fifth time t5, a frequency of the clock signal CLK in the capture cycle is the same as a frequency of the clock signal CLK for performing a normal function. Thus, the transition delay fault of the logic circuit 105 may be identified by using the clock signal CLK that has the same frequency as the clock signal CLK for the normal function.

As described above, according to an exemplary embodiment, the AT-SPEED test of the logic circuit 105 may be performed based on the two registers 101 and 106. In this case, the inverting circuit 102 on a feedback path of the first register 101 may perform a role of a logic circuit providing data to the first register 101. Accordingly, in the AT-SPEED test of the logic circuit 105, the first register 101 may perform a role of two registers on a function path.

Figure 7:
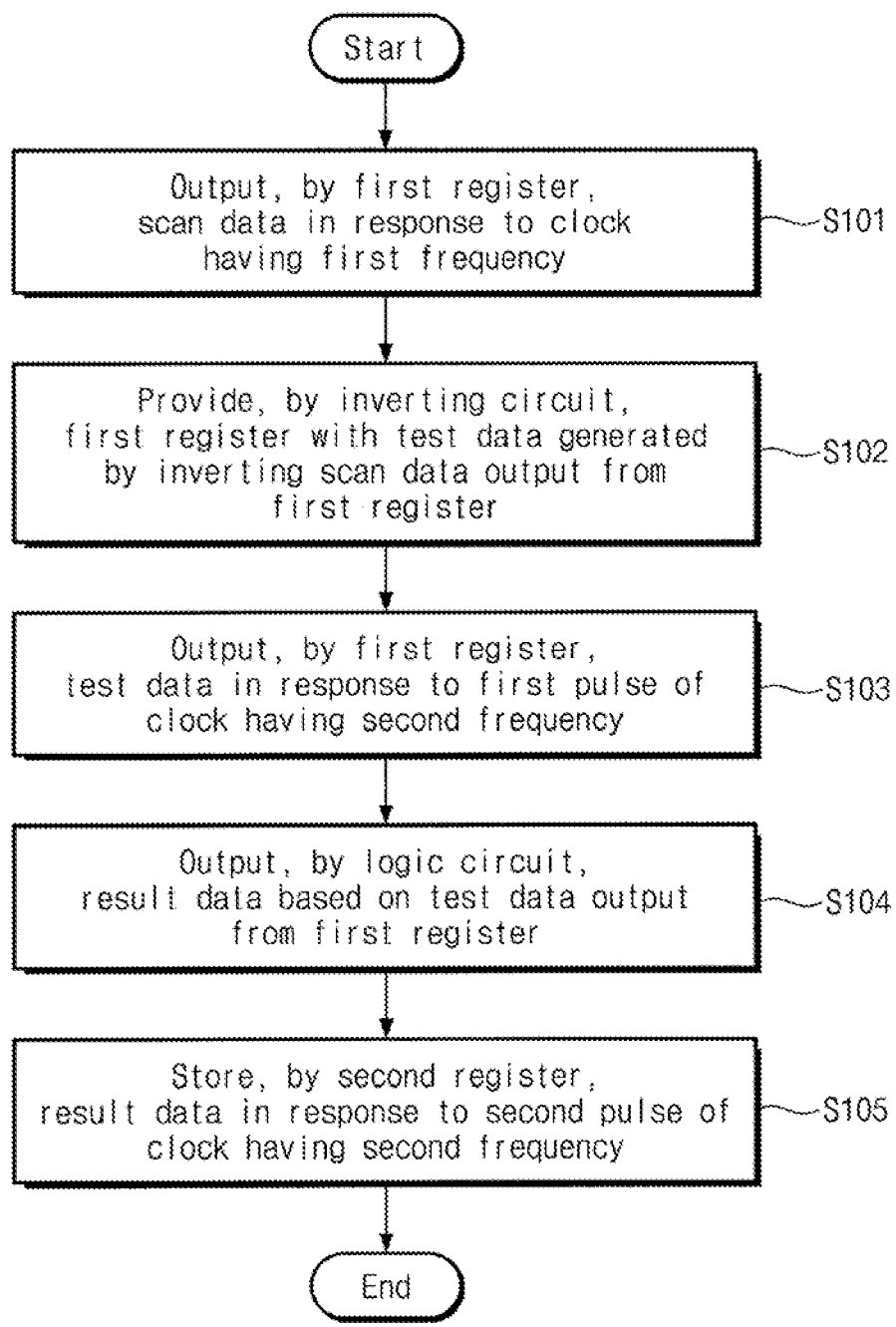
FIG. 7 illustrates a flowchart of an exemplary operation of a SoC of FIG. 4 for an AT-SPEED test.

FIG. 7 illustrates an exemplary operation of the SoC 100 of FIG. 4 for an AT-SPEED test. Referring to FIGS. 4, 5, and 7, in operation S101, the first register 101 may output scan data SD in response to the clock signal CLK having a first frequency. In operation S102, the inverting circuit 102 may provide the first register 101 with the test data TD that are generated by inverting the scan data SD output from the first register 101. For example, the selecting circuit 103 may output the test data TD as the first input data ID1 based on the selection signal CS. The test data TD output from the selecting circuit 103 may be provided to the first register 101.

In operation S103, the first register 101 may output the test data TD in response to the first pulse P1 of the clock signal CLK having a second frequency. The first register 101 may output the test data TD as the first output data OD1. In operation S104, the logic circuit 105 may generate result data based on the test data TD output from the first register 101. The logic circuit 105 may provide the result data to the second register 106 as the second input data ID2. In operation S105, the second register 106 may store the result data in response to the second pulse P2 of the clock signal CLK having the second frequency. The transition delay fault of the logic circuit 105 may be identified based on the stored result data using the first and second pulses P1 and P2 having the second frequency.

According to an exemplary embodiment, the first register 101 of FIG. 1 may be included in an input wrapper register or an output wrapper register. For example, the inverting circuit 102 and the selecting circuit 103 may be positioned on a feedback path of the input wrapper register or the output wrapper register. Examples for AT-SPEED tests of logic circuits, which are positioned at various positions, will be described with reference to FIGS. 8 to 11.

Figure 8:
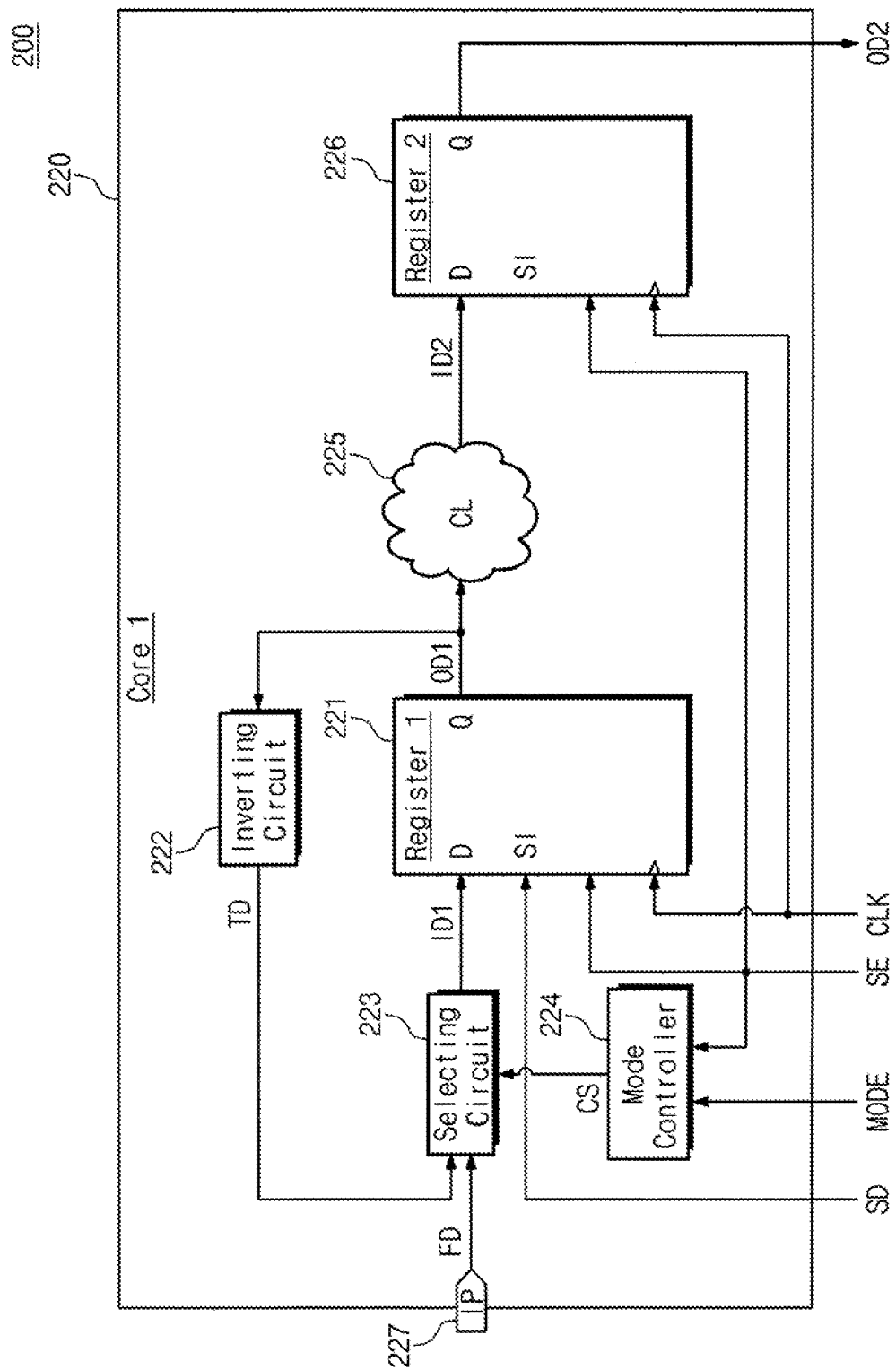
FIG. 8 illustrates a SoC for an AT-SPEED test of a logic circuit according to an exemplary embodiment.

FIG. 8 illustrates a SoC 200 for an AT-SPEED test of a logic circuit 225 according to an exemplary embodiment. Referring to FIG. 8, the SoC 200 may include a first core 220. The first core 220 may be one of low level cores of the SoC 200, as described with reference to FIG. 1. The first core 220 may include a first register 221, an inverting circuit 222, a selecting circuit 223, a mode controller 224, a logic circuit 225, a second register 226, and an input port 227. Operations of the first register 221, the inverting circuit 222, the selecting circuit 223, the mode controller 224, the logic circuit 225, and the second register 226 may be substantially the same as or similar to the operations of the first register 101, the inverting circuit 102, the selecting circuit 103, the mode controller 104, the logic circuit 105, and the second register 106 of FIG. 4.

The first register 221 may be included in an input wrapper register that is closest to the input port 227. Function data FD provided through the input port 227 may be transferred to the selecting circuit 223. For example, the function data FD may be provided from a separate core. For example, the function data FD may be provided from a top level core or another low level core.

As described with reference to FIGS. 4 to 6, the AT-SPEED test of the logic circuit 225 between the first register 221 and the second register 226 may be performed based on the first and second registers 221 and 226. For example, the logic circuit 225 may process data that are output from the first register 221 as the input wrapper register to perform an AT-SPEED test thereof by using the inverting circuit 222 on a feedback path of the first register 221. Thus, an AT-SPEED test of a logic circuit, which processes output data that are output from an input wrapper register, may be performed using an inverting circuit on a feedback path of the input wrapper register.

Figure 9:
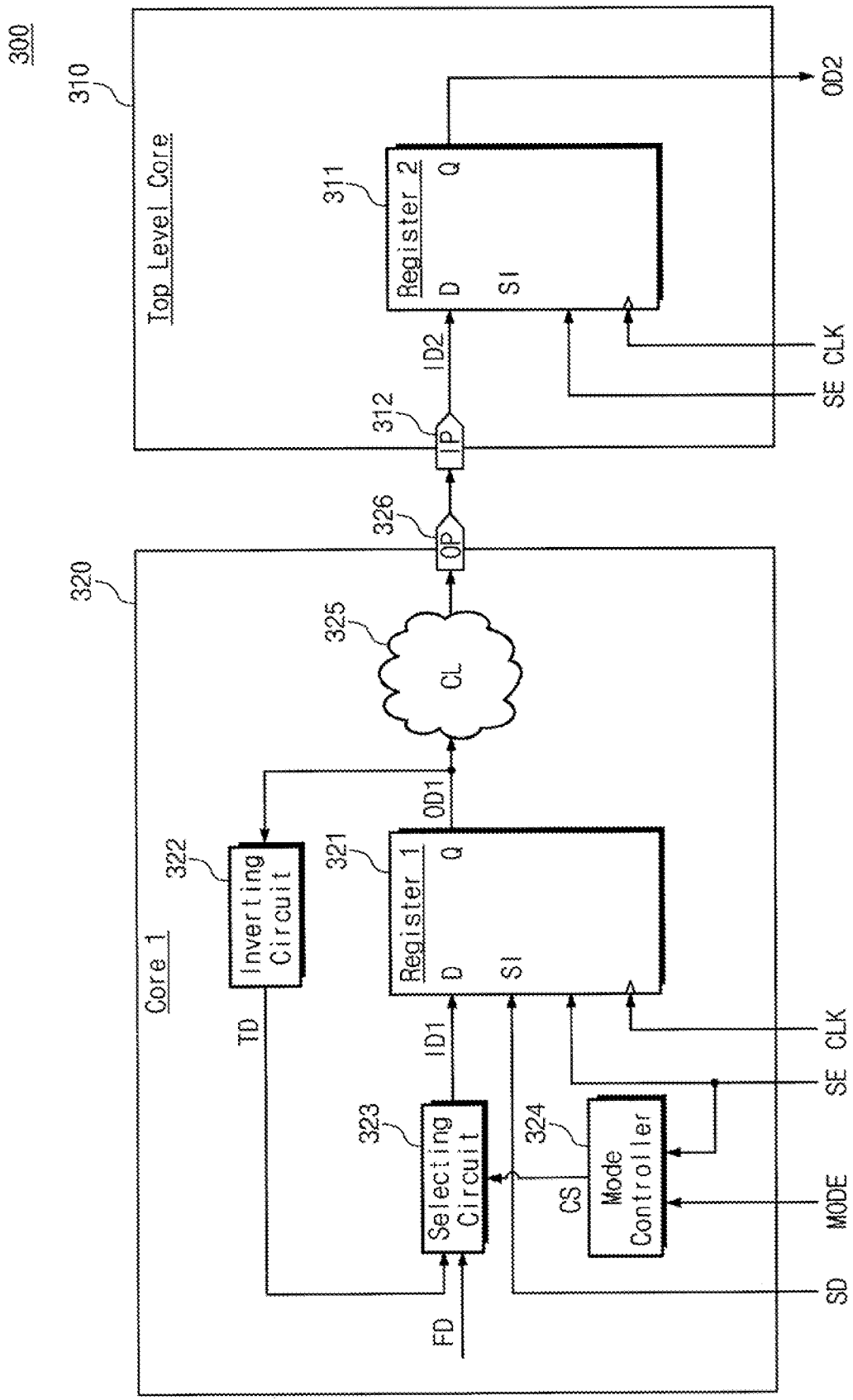
FIG. 9 illustrates a SoC for an AT-SPEED test of a logic circuit according to an exemplary embodiment.

FIG. 9 illustrates a SoC 300 for an AT-SPEED test of a logic circuit 325 according to an exemplary embodiment. Referring to FIG. 9, the SoC 300 may include a top level core 310 and a first core 320. The first core 320 may be one of low level cores of the SoC 300, as described with reference to FIG. 1. The top level core 310 may include a second register 311 and an input port 312. The first core 320 may include a first register 321, an inverting circuit 322, a selecting circuit 323, a mode controller 324, the logic circuit 325, and an output port 326.

The first register 321 may be included in an output wrapper register that is closest to the output port 326. The output port 326 of the first core 320 may be connected to the input port 312 of the top level core 310. For example, data that are output from the logic circuit 325 may be transferred to the second register 311 of the top level core 310 through the output port 326 and the input port 312. The output data of the logic circuit 325 as the second input data ID2 may be provided to the second register 311. Thus, because the first register 321 and the second register 311 are positioned on one function path, the AT-SPEED test of the logic circuit 325 may be performed using the first register 321 and the second register 311.

Referring to FIGS. 5 and 9, at the second time t2, the first register 321 may store the scan data SD in response to the rising edge of the clock signal CLK. The first register 321 may output the scan data SD as the first output data OD1. The inverting circuit 322 may generate the test data TD by inverting the scan data SD that are output from the first register 321. The test data TD may be provided to the selecting circuit 323.

At the third time t3, the mode controller 324 may generate the selection signal CS based on the mode signal MODE and a logical low value of the scan enable signal SE, such that the test data TD are output from the selecting circuit 323 to the first register 321. For example, the mode signal MODE may indicate the AT-SPEED test mode of the logic circuit 325. The selecting circuit 323 may select one of the test data TD and the function data FD based on a selection signal CS to output the selected one as the first input data ID1. Thus, the test data TD may be input to the input data terminal "D" of the first register 321.

At the fourth time t4, the first register 321 may output the test data TD as the first output data OD1 in response to a rising edge of the clock signal CLK. The logic circuit 325 may perform an operation based on the test data TD and may output result data as a result of the operation. The result data as the second input data ID2 may be provided to the second register 311 through the output port 326 and the input port 312. At the fifth time t5, the second register 311 may store the result data in response to a rising edge of the clock signal CLK. The result data may be output as the second output data OD2. Thus, the transition delay fault of the logic circuit 325 may be identified based on the second output data OD2.

As described above, in the case where the AT-SPEED test of the logic circuit 325 is performed, the AT-SPEED test may be performed on an interface (e.g., the logic circuit 325) between the top level core 310 and the first core 320.

FIG. 9 illustrates that the logic circuit 325 is included in the first core 320. Alternatively, the logic circuit 325 may be included in the top level core 310. For example, the AT- SPEED test may be performed on a logic circuit that is positioned between the first register 321 and the second register 311.

Figure 10:
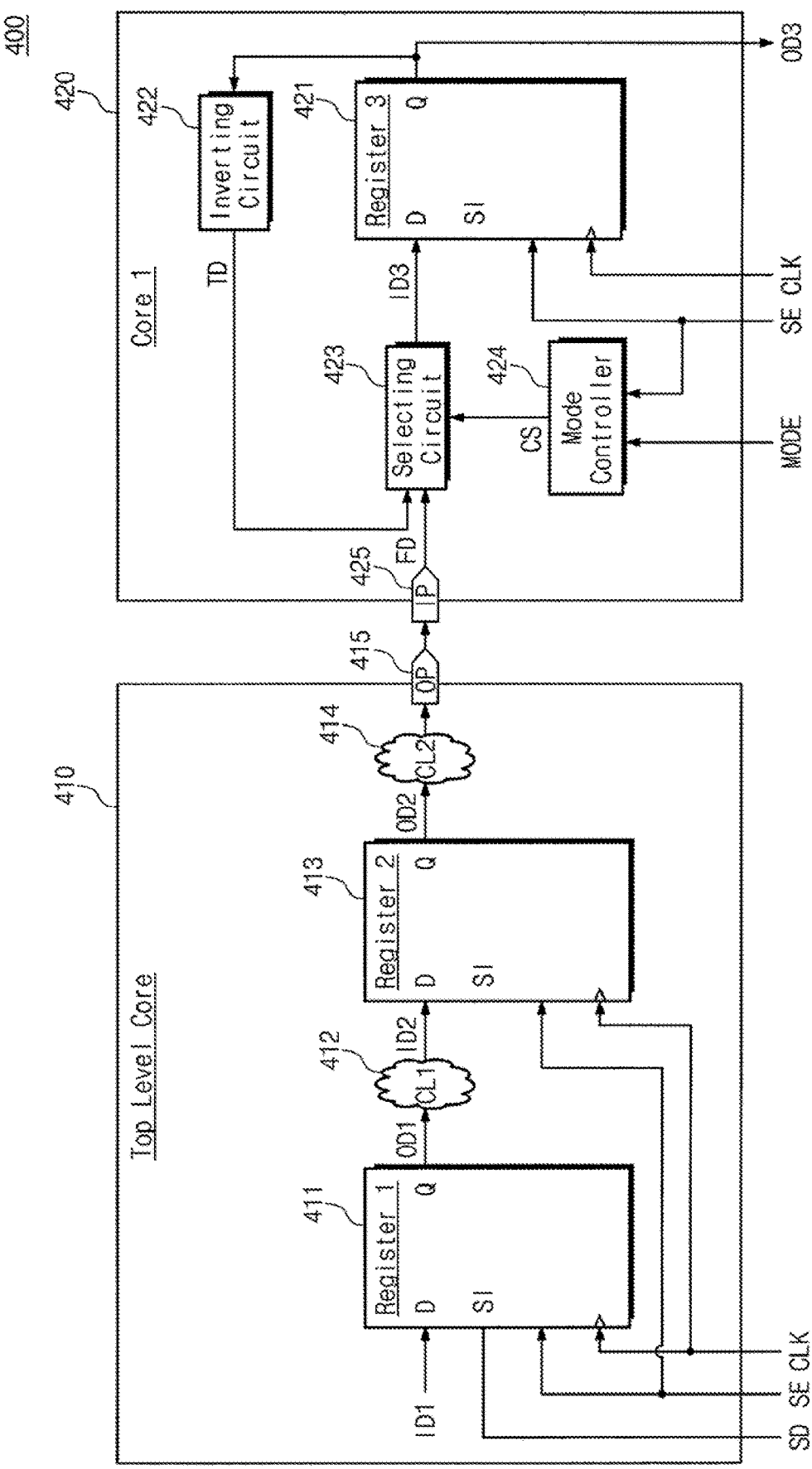
FIG. 10 illustrates a SoC for an AT-SPEED test of a logic circuit according to an exemplary embodiment.

FIG. 10 illustrates a SoC 400 for an AT-SPEED test of a logic circuit 414 according to an exemplary embodiment. Referring to FIG. 10, the SoC 400 may include a top level core 410 and a first core 420. The first core 420 may be one of low level cores of the SoC 400, as described with reference to FIG. 1. The top level core 410 may include a first register 411, a first logic circuit 412, a second register 413, a second logic circuit 414, and an output port 415. The first core 420 may include a third register 421, an inverting circuit 422, a selecting circuit 423, a mode controller 424, and an input port 425. For the AT-SPEED test of the second logic circuit 414, it is assumed that the first logic circuit 412 does not have any defect.

The third register 421 may be included in an input wrapper register that is closest to the input port 425. The output port 415 of the top level core 410 may be connected to the input port 425 of the first core 420. For example, data output from the second logic circuit 414 may be transferred to the selecting circuit 423 of the first core 420 through the output port 415 and the input port 425. Thus, the output data of the second logic circuit 414 may be provided as the function data FD. For example, the first register 411, the second register 413, and the third register 421 may be positioned on one function path. Thus, the AT-SPEED test of the second logic circuit 414 may be performed by using the first, second, and third registers 411, 413, and 421.

The mode signal MODE may indicate the AT-SPEED test mode of the second logic circuit 414. The mode controller 424 may generate the selection signal CS based on the mode signal MODE such that the selecting circuit 423 outputs the function data FD. For example, the mode controller 424 may generate the selection signal CS regardless of a value of the scan enable signal SE such that the function data FD are output from the selecting circuit 423. Thus, the test data TD output from the inverting circuit 422 may not be used for the AT-SPEED test of the second logic circuit 414.

Referring to FIGS. 5 and 10, at the second time t2, the first register 411 may store the scan data SD in response to a rising edge of the clock signal CLK. The first register 411 may output the scan data SD as the first output data OD1. The first logic circuit 412 may perform an operation based on the scan data SD and may output a result of the operation. Thus, the operation result may be provided to an input data terminal "D" of the second register 413 as the second input data ID2.

At the fourth time t4, the second register 413 may output the operation result as the second output data OD2 in response to a rising edge of the clock signal CLK. The second logic circuit 414 may perform an operation based on the second output data OD2 and may output result data as a result of the operation. The result data as the function data FD may be provided to the selecting circuit 423 through the output port 415 and the input port 425. The selecting circuit 423 may output the result data in response to the selection signal CS. Thus, the result data as third input data ID3 may be input to the third register 421.

At the fifth time t5, the third register 421 may store the result data in response to a rising edge of the clock signal CLK. The result data may be output as third output data OD3. For example, the transition delay fault of the second logic circuit 414 may be identified based on the third output data OD3.

As described above, when AT-SPEED test of the second logic circuit 414 is performed, the AT-SPEED test may be performed on an interface between the top level core 410 and the first core 420.

An example is illustrated in FIG. 10 as the second logic circuit 414 is included in the top level core 410, but embodiments may not be limited thereto. For example, the second logic circuit 414 may be included in the first core 420. Thus, the AT-SPEED test may be performed on a logic circuit positioned between the second register 413 and the third register 421.

As illustrated in FIGS. 9 and 10, according to exemplary embodiments, an AT-SPEED test may be properly performed on an interface between a top level core and a low level core.

Figure 11:
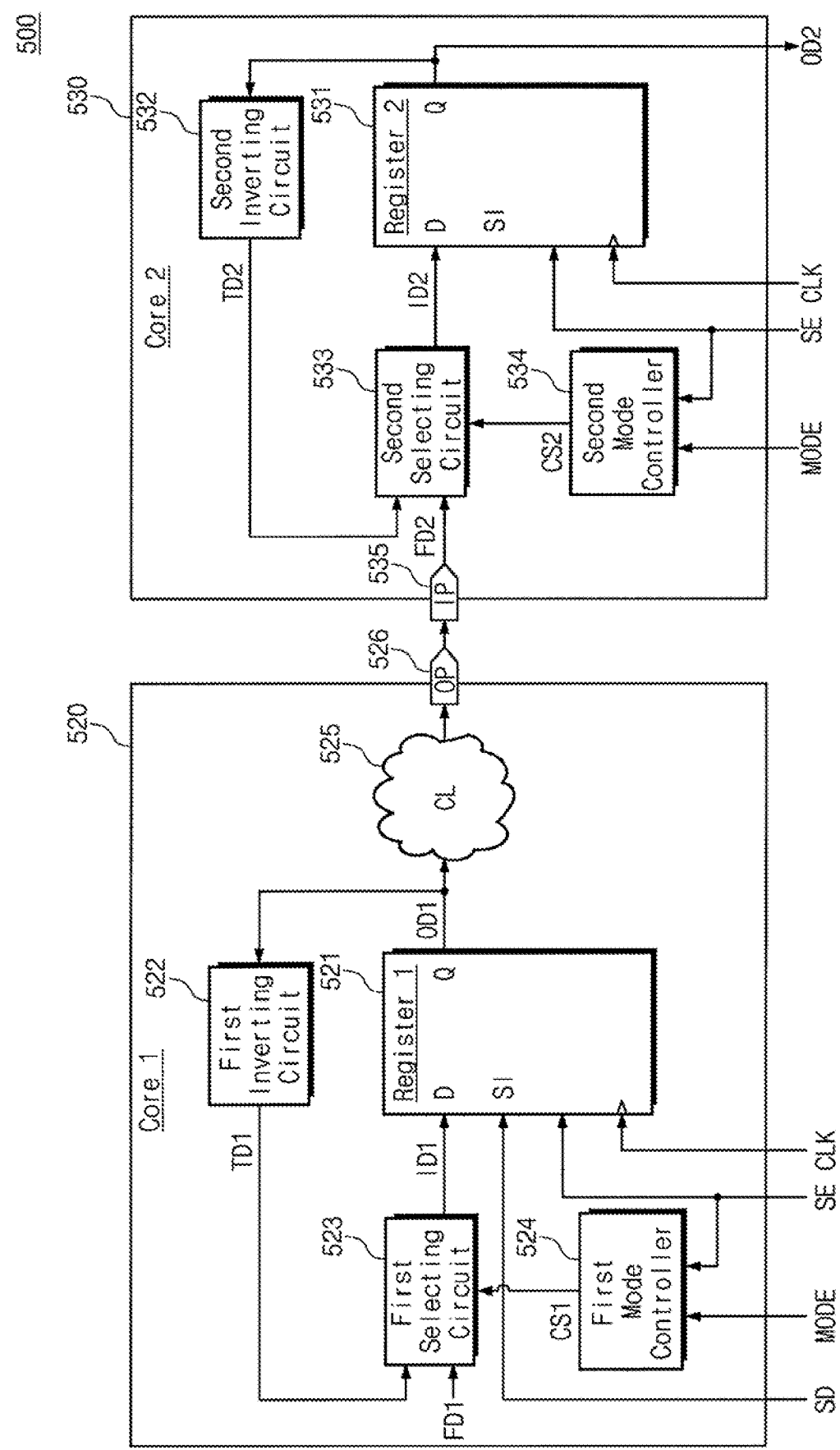
FIG. 11 illustrates a SoC for an AT-SPEED test of a logic circuit according to an exemplary embodiment.

FIG. 11 illustrates a SoC 500 for an AT-SPEED test of a logic circuit 525 according to an exemplary embodiment. Referring to FIG. 11, the SoC 500 may include a first core 520 and a second core 530. Each of the first and second cores 520 and 530 may be one of low level cores of the SoC 500, as described with reference to FIG. 1. The first core 520 may include a first register 521, a first inverting circuit 522, a first selecting circuit 523, a first mode controller 524, the logic circuit 525, and an output port 526. The second core 530 may include a second register 531, a second inverting circuit 532, a second selecting circuit 533, a second mode controller 534, and an input port 535.

The first register 521 may be included in an output wrapper register that is closest to the output port 526. The second register 531 may be included in an input wrapper register that is closest to the input port 535. The output port 526 of the first core 520 may be connected to the input port 535 of the second core 530. For example, data output from the logic circuit 525 may be transferred to the second selecting circuit 533 of the second core 530 through the output port 526 and the input port 535. The output data of the logic circuit 525 may be provided as second function data FD2. For example, the first register 521 and the second register 531 may be positioned on one function path. Thus, the AT-SPEED test of the logic circuit 525 may be performed by using the first and second registers 521 and 531.

The mode signal MODE may indicate the AT-SPEED test mode of the logic circuit 525. The second mode controller 534 may generate a second selection signal CS2 based on the mode signal MODE such that the second selecting circuit 533 outputs the second function data FD2. The second mode controller 534 may generate the second selection signal CS2 regardless of a value of the scan enable signal SE such that the second function data FD2 are output from the second selecting circuit 533. Thus, second test data TD2 output from the second inverting circuit 532 may not be used for the AT-SPEED test of the logic circuit 525.

Referring to FIGS. 5 and 11, at the second time t2, the first register 521 may store the scan data SD in response to a rising edge of the clock signal CLK. The first register 521 may output the scan data SD as the first output data OD1. The first inverting circuit 522 may invert the scan data SD output from the first register 521 to generate first test data TD1. The first test data TD1 may be provided to the first selecting circuit 523.

At the third time t3, the first mode controller 524 may generate the first selection signal CS1 based on the mode signal MODE and a logical low value of the scan enable signal SE, such that the first test data TD1 are output from the first selecting circuit 523. The first selecting circuit 523 may output the first test data TD1 as the first input data ID1 based on the first selection signal CS1. Thus, the first test data TD1 may be input to an input data terminal "D" of the first register 521.

At the fourth time t4, the first register 521 may output the first test data TD1 as the first output data OD1 in response to a rising edge of the clock signal CLK. The logic circuit 525 may perform an operation based on the first test data TD1 and may output result data as a result of the operation. The result data as the second function data FD2 may be provided to the second selecting circuit 533 through the output port 526 and the input port 535. The second selecting circuit 533 may output the result data in response to the second selection signal CS2. Thus, the result data as the second input data ID2 may be provided to the second register 531.

At the fifth time t5, the second register 531 may store the result data in response to a rising edge of the clock signal CLK. The result data may be output as the second output data OD2. Thus, the transition delay fault of the logic circuit 525 may be identified based on the second output data OD2.

As described above, when the AT-SPEED test of the logic circuit 525 is performed, the AT-SPEED test may be performed on an interface between the first core 520 and the second core 530. According to exemplary embodiments, an AT-SPEED test may be properly performed on an interface between low level cores.

As illustrated in FIG. 11, in response to the same mode signal MODE, the first mode controller 524 and the second mode controller 534 may operate differently from each other. Each of the first and second mode controllers 524 and 534 may generate the selection signal CS based on a location of the logic circuit 525 that is targeted for a test. For example, because the logic circuit 525 is positioned on an output data path with respect to the first selecting circuit 523, the first mode controller 524 may generate the first selection signal CS1 such that the first test data TD1 are output from the first selecting circuit 523. For example, because the logic circuit 525 is positioned on an input data path with respect to the second selecting circuit 533, the second mode controller 534 may generate the second selection signal CS2 such that the second function data FD2 are output from the second selecting circuit 533.

FIG. 11 illustrates that the logic circuit 525 is included in the first core 520, but exemplary embodiments may not be limited thereto. For example, the logic circuit 525 may be included in the second core 530. Thus, the AT-SPEED test may be performed on a logic circuit positioned between the first register 521 and the second register 531.

Figure 12:
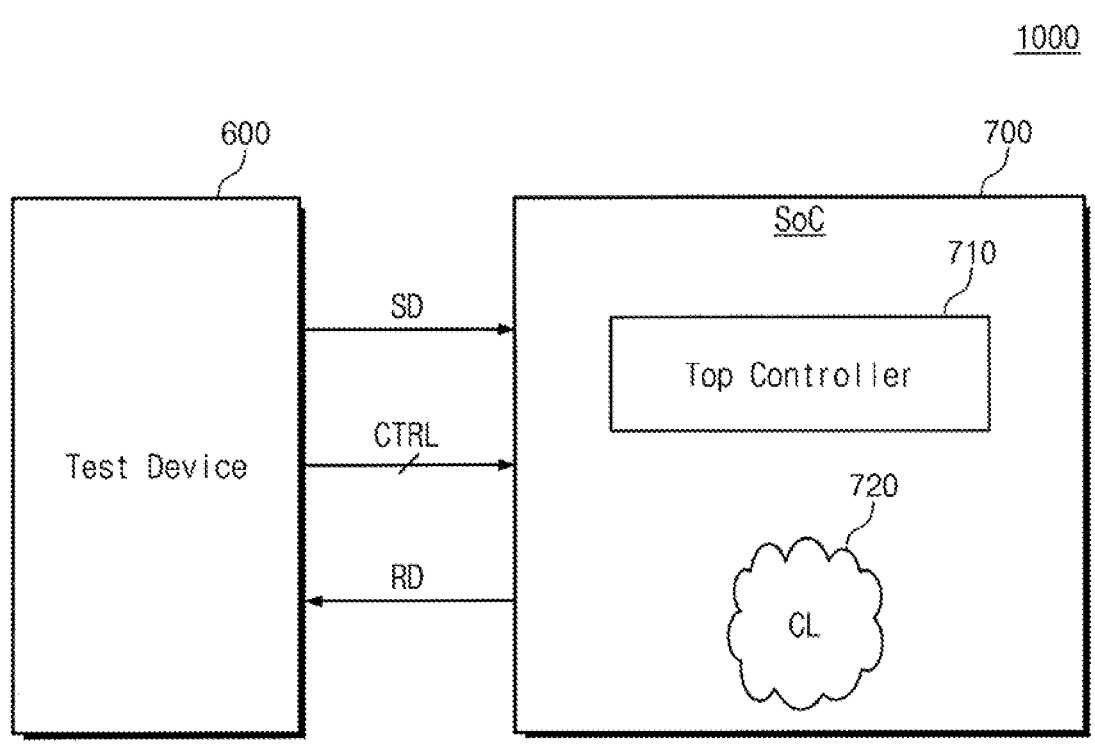
FIG. 12 illustrates a test system according to an exemplary embodiment.

FIG. 12 illustrates a test system 1000 according to an exemplary embodiment. Referring to FIG. 12, the test system 1000 may include a test device 600 and a SoC 700. The SoC 700 may include a top controller 710 and a logic circuit 720.

The test device 600 may perform a scan test on the logic circuit 720 of the SoC 700 to identify a defect of the logic circuit 720. For the scan test, the test device 600 may provide scan data SD to the SoC 700. The test device 600 may receive result data RD output from the SoC 700 based on the scan data SD. The result data RD may be generated by the logic circuit 720 based on the scan data SD and may be output from the logic circuit 720. The test device 600 may identify a defect of the logic circuit 720 based on the result data RD. For example, when the logic circuit 720 has the defect, the result data RD may be different from a target data.

For the scan test for the logic circuit 720, the test device 600 may provide control signals CTRL to the SoC 700. The control signals CTRL may include various signals for the scan test. For example, the control signals CTRL may include the scan enable signal SE, the clock signal CLK, information about a test target, information about a test mode, etc. The SoC 700 may perform an operation for testing the logic circuit 720 based on the control signals CTRL.

The top controller 710 may generate internal control signals for controlling operations of internal circuits of the SoC 700 based on the control signals CTRL. For example, the top controller 710 may generate the mode signal MODE indicating a test mode of the logic circuit 720. An operation for testing the logic circuit 720 may be performed based on the internal control signals that are generated from the top controller 710.

For example, for the AT-SPEED test of the logic circuit 720, the test device 600 may provide the scan data SD and scan control signals CTRL to the SoC 700. The top controller 710 may generate the mode signal MODE based on the control signals CTRL. The mode signal MODE may indicate the AT-SPEED test mode of the logic circuit 720. As described with reference to FIGS. 1 to 11, the AT-SPEED test of the logic circuit 720 may be performed based on the scan data SD, the mode signal MODE, the scan enable signal SE, and the clock signal CLK. Thus, the AT-SPEED test of the logic circuit 720 may be performed regardless of a position of the logic circuit 720.

Figure 13:
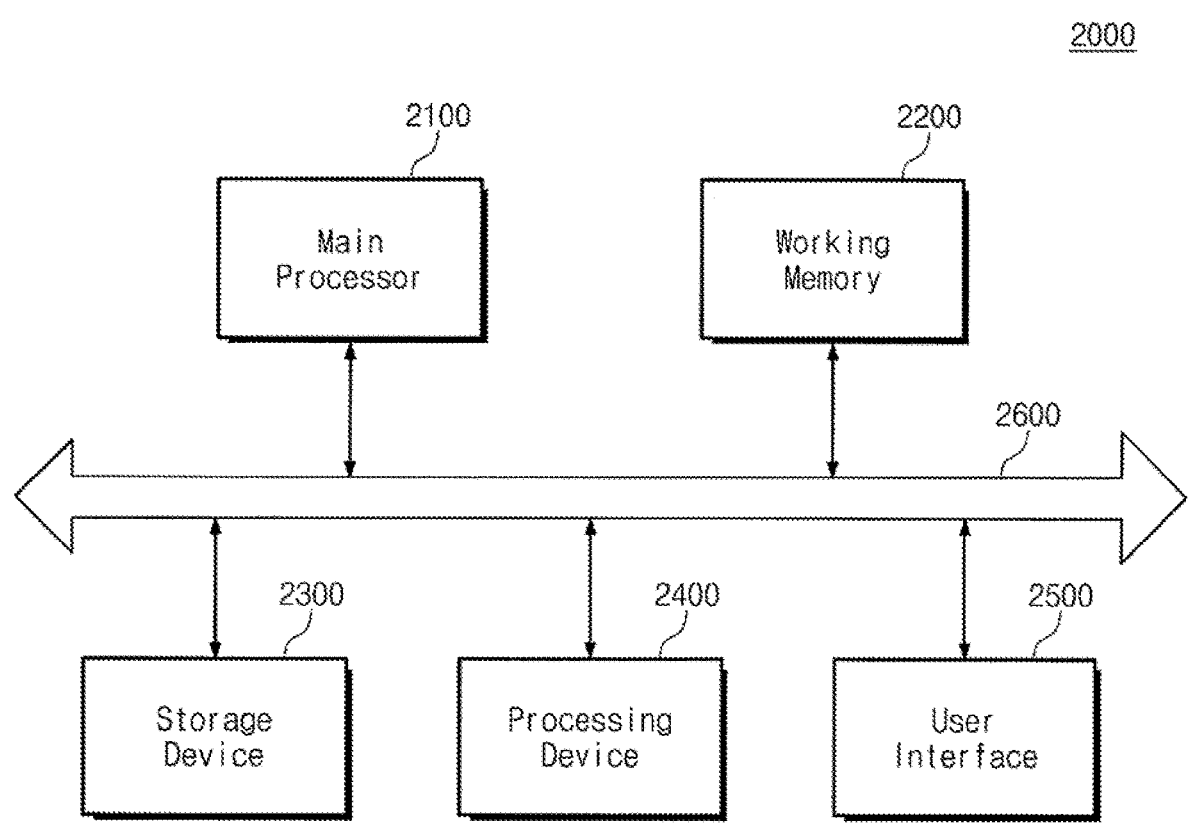
FIG. 13 illustrates an exemplary configuration of an electronic system to which a SoC is applied according to an exemplary embodiment.

FIG. 13 illustrates an exemplary configuration of an electronic system 2000 to which a SoC according to an exemplary embodiment is applied.

The electronic system 2000 may include a main processor 2100, a working memory 2200, a storage device 2300, a processing device 2400, a user interface 2500, and a bus 2600. For example, the electronic system 2000 may be one of a desktop computer, a laptop computer, a tablet computer, a smartphone, a wearable device, an electric vehicle, a workstation, etc. For example, the electronic system 2000 may be an electronic device that is used by an end-user. Alternatively, the electronic system 2000 may be a component of a large scale system, e.g., a server system, a data center, etc.

The main processor 2100 may control overall operations of the electronic system 2000. The main processor 2100 may process various kinds of arithmetic operations and/or logical operations. As described with reference to FIGS. 1 to 12, the main processor 2100 may be implemented in the form of a SoC including a plurality of cores. Thus, the AT-SPEED test may be properly performed on a logic circuit of the main processor 2100.

The working memory 2200 may store data for an operation of the electronic system 2000. In an embodiment, the working memory 2200 may temporarily store data that are processed or to be processed by the main processor 2100. For example, the working memory 2200 may include a volatile memory (e.g., a dynamic random access memory (DRAM), a synchronous DRAM (SDRAM), or the like) and/or a nonvolatile memory (e.g., a phase-change RAM (PRAM), a magneto-resistive RAM (MRAM), a resistive RAM (ReRAM), a ferroelectric RAM (FRAM), or the like).

The storage device 2300 may store data regardless of whether power is supplied. For example, the storage device 2300 may include a nonvolatile memory, e.g., a flash memory, a PRAM, an MRAM, a ReRAM, an FRAM, etc. For example, the storage device 2300 may include a storage medium, e.g., a hard disk drive (HDD), a solid state drive (SSD), card storage, embedded storage, etc.

The processing device 2400 may process input data under control of the main processor 2100. The processing device

2400 may process the input data through various operations. The processing device 2400 may provide the processed input data to the main processor 2100. The processing device 2400 may be a dedicated processor that is specialized in a specific operation. For example, the processing device 2400 may be implemented with a graphic processing unit (GPU), a neural processing unit (NPU), a digital signal processor (DSP), etc. As described with reference to FIGS. 1 to 12, the processing device 2400 may be implemented in the form of a SoC including a plurality of cores. Thus, the AT-SPEED test may be properly performed on a logic circuit of the processing device 2400.

The user interface 2500 may perform communication arbitration between a user and the electronic system 2000. For example, the user interface 2500 may include input interfaces, e.g., a keyboard, a mouse, a keypad, a button, a touch panel, a touch screen, a touch pad, a touch ball, a camera, a microphone, a gyroscope sensor, a vibration sensor, etc. For example, the user interface 2500 may include output interfaces, e.g., a liquid crystal display (LCD) device, a light emitting diode (LED) display device, an organic LED (OLED) display device, an active matrix OLED (AMOLED) display device, a speaker, a motor, etc.

The bus 2600 may provide communication paths between components of the electronic system 2000. The components of the electronic system 2000 may exchange data with each other based on a bus format of the bus 2600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), universal flash storage (UFS), etc.

According to embodiments, a SoC in which an AT-SPEED test of a logic circuit may be performed regardless a position of the logic circuit and an operating method thereof may be provided.

Also, according to embodiments, a SoC in which a transition delay fault of an interface circuit between low level cores and an interface circuit between a top level core and a lower level core may be properly and efficiently identified and an operating method thereof may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A system-on-chip including a plurality of cores, comprising:
   an input port;
   a first scan register in a first core of the plurality of cores, the first scan register receiving scan data from the input port;
   an inverting circuit on a feedback path of the first scan register; and
   a logic circuit connected to an output terminal of the first scan register, wherein:
   in a test mode for an AT-SPEED test of the logic circuit, the inverting circuit generates test data by inverting the scan data that are output from the first scan register,
   the first scan register stores the test data in response to a first pulse of a clock signal, and
   the logic circuit generates result data based on the test data that are output from the first scan register.

2. The system-on-chip as claimed in claim 1, further comprising a second scan register in the first core,
   wherein the second scan register stores the result data from the logic circuit, in response to a second pulse of the clock signal.

3. The system-on-chip as claimed in claim 2, wherein a transition delay fault of the logic circuit is identified by comparing target data with the result data stored in the second scan register.

4. The system-on-chip as claimed in claim 2, wherein the test mode for the AT-SPEED test of the logic circuit includes:
   a first shift cycle in which the first scan register stores the scan data from the input port;
   a capture cycle in which the second register stores the result data from the logic circuit; and
   a second shift cycle in which the second register outputs the stored result data.

5. The system-on-chip as claimed in claim 4, wherein the clock signal has a first frequency in the first shift cycle and the second shift cycle, and the clock signal has a second frequency different from the first frequency in the capture cycle.

6. The system-on-chip as claimed in claim 5, wherein the first frequency is lower than the second frequency.

7. The system-on-chip as claimed in claim 2, wherein the second pulse is adjacent to the first pulse.

8. The system-on-chip as claimed in claim 1, wherein the test mode for the AT-SPEED test of the logic circuit includes:
   a shift cycle in which the clock signal has a first frequency; and
   a capture cycle in which the clock signal has a second frequency higher than the first frequency.

9. The system-on-chip as claimed in claim 1, further comprising a selecting circuit to provide the first scan register with one of function data from the input port and the test data from the inverting circuit, wherein:
   in the test mode, the selecting circuit selects the test data to provide the test data to the first scan register, and
   the function data are provided from a top level core of the plurality of cores.

10. A system-on-chip, comprising:
    a first core including:
       an output port;
       a first scan register receiving scan data;
       a first inverting circuit on a feedback path of the first scan register; and
       a logic circuit connected between an output terminal of the first scan register and the output port; and
    a second core including an input port connected to the output port of the first core, wherein:
    in a test mode for an AT-SPEED test of the logic circuit, the first inverting circuit generates test data by inverting the scan data that are output from the first scan register,
    the first scan register stores the test data in response to a first pulse of a clock signal, and the logic circuit generates result data based on the test data that are output from the first scan register.

11. The system-on-chip as claimed in claim 10, wherein:
the second core further includes a second scan register connected to the input port of the second core, and
the second scan register stores the result data from the logic circuit, in response to a second pulse of the clock signal.

12. The system-on-chip as claimed in claim 11, wherein the test mode for the AT-SPEED test of the logic circuit includes:
a first shift cycle in which the first scan register stores the scan data;
a capture cycle in which the second register stores the result data from the logic circuit; and
a second shift cycle in which the second register outputs the stored result data.

13. The system-on-chip as claimed in claim 12, wherein the clock signal has a first frequency in the first shift cycle and the second shift cycle, and the clock signal has a second frequency higher than the first frequency in the capture cycle.

14. The system-on-chip as claimed in claim 10, wherein the second core is a top level core.

15. The system-on-chip as claimed in claim 10, wherein:
the second core further includes:
a second scan register;
a second inverting circuit on a feedback path of the second scan register; and
a selecting circuit connected between the second scan register and the input port of the second core, the selecting circuit providing the second scan register with one of function data from the input port of the second core and test data from the second inverting circuit, and the second scan register stores the one of the function data from the input port of the second core and the test data from the second inverting circuit, in response to a second pulse of the clock signal.

16. An operating method of a system-on-chip including a first scan register, an inverting circuit, and a logic circuit, the method comprising:
outputting, by the first scan register, scan data in response to a clock signal having a first frequency;
providing the first scan register with test data generated by inverting the scan data that are output from the first scan register;
outputting, by the first scan register, the test data in response to a first pulse of the clock signal having a second frequency; and
outputting, by the logic circuit, result data based on the test data that are output from the first scan register.

17. The method as claimed in claim 16, wherein the system-on-chip further includes a second scan register, the method further comprising:
outputting, by the second scan register, the result data in response to a second pulse of the clock signal having the second frequency.

18. The method as claimed in claim 17, wherein the second pulse is adjacent to the first pulse.

19. The method as claimed in claim 17, wherein:
the system-on-chip includes a first core and a second core,
the first core includes the first scan register, the inverting circuit, the logic circuit, and an output port connected to the logic circuit, and
the second core includes the second scan register, and an input port connected to the output port of the first core.

20. The method as claimed in claim 19, wherein the second core is a top level core.

* * * * *